US008332176B2

(12) United States Patent
Custode et al.

(10) Patent No.: US 8,332,176 B2
(45) Date of Patent: Dec. 11, 2012

(54) CORRECTING IN-LINE SPECTROPHOTOMETER MEASUREMENTS IN THE PRESENCE OF A BANDING DEFECT

(75) Inventors: Beatriz Cristina Custode, Webster, NY (US); Stuart Alan Schweid, Pittsford, NY (US); James Edward Baxter, III, Canandaigua, NY (US)

(73) Assignee: Xerox Corporation, Norwalk, CT (US)

( * ) Notice: Subject to any disclaimer, the term of this patent is extended or adjusted under 35 U.S.C. 154(b) by 319 days.

(21) Appl. No.: 12/819,565

(22) Filed: Jun. 21, 2010

(65) Prior Publication Data

US 2011/0313707 A1 Dec. 22, 2011

(51) Int. Cl.
*G01R 33/56* (2006.01)
*G01R 33/565* (2006.01)

(52) U.S. Cl. ........................ 702/106; 358/3.26; 358/518

(58) Field of Classification Search .................. 702/106; 358/3.26

See application file for complete search history.

(56) References Cited

U.S. PATENT DOCUMENTS 3,608,381 A * 9/1971 Hines .............................. 73/462
6,321,602 B1 * 11/2001 Ben-Romdhane .............. 73/660
7,054,568 B2 5/2006 Mizes et al.
7,058,325 B2 6/2006 Hamby et al.
2007/0201097 A1 * 8/2007 Anderson et al. ............ 358/3.06
2009/0046325 A1 * 2/2009 Paul et al. .................... 358/3.26
2009/0225341 A1 * 9/2009 Matsuzawa .................... 358/1.9

* cited by examiner

*Primary Examiner* — Cindy H Khuu
*Assistant Examiner* — Alexander Satanovsky
(74) *Attorney, Agent, or Firm* — Philip E. Blair; Fleit Gibbons Gutman Bongini & Bianco P.L.

(57) ABSTRACT

What is disclosed is a novel system and method for detecting and correcting for In-Line-Spectrophotometer (ILS) measurements of constant value patches in the presence of banding in multi-function document reproduction systems. The present system analyzes the ILS data stream to identify structured noise components due to banding. An FFT is performed on each L*a*b* component in the ILS stream for a single test page. The peak frequencies from the FFT of the L* a* and b* channels are compared. Common frequencies in all 3 channels indicate a banding component. Once the banding frequencies and the banding wavelength are known, the color patch target can be adjusted to ensure the color patches are synchronized to the banding wavelength. By running a series of synchronized patches and averaging results, structured noise can be eliminated. In such a manner, a reduction of banding effects on color calibration can be effectuated.

14 Claims, 5 Drawing Sheets

CORRECTING IN-LINE SPECTROPHOTOMETER MEASUREMENTS IN THE PRESENCE OF A BANDING DEFECT

TECHNICAL FIELD

The present invention is directed to systems and methods for correcting measurements obtained using an in-line spectrophotometer from color test patches in the presence of a banding defect in a digital document reproduction device.

BACKGROUND

In a typical multi-function document reproduction system, a photoconductive drum or photoreceptor belt rotates at an angular velocity and, as the photoconductive drum rotates, the drum is electrostatically charged. A latent image is exposed line-by-line onto the photoconductive drum using a scanning laser and, for instance, a rotating polygon mirror. The latent image is developed by electrostatically adhering toner particles to the photoconductive drum. The developed image is transferred from the photoconductive drum to the output media such as paper. The toner image on the paper is fused to the paper to make the image on the paper permanent. The surface of the photoconductive drum is cleaned to remove any residual toner on the surface of the photoconductive drum. Typically, the printing device drives the photoconductive drum using a motor drive system or a motor drive train. The motor drive system has a substantial amount of external loading because it typically drives the auxiliary rollers and transports the paper through a series of gear trains. With the additional external loading, as well as periodic disturbances due to imperfections in the series of gear trains, the motor drive system imparts a varying velocity on the photoconductive drum. The varying photoconductive drum velocity causes scanline spacing variation in the printed image. The scanline spacing variation is a significant contributor of artifacts in the marking process. For example, halftone banding caused by scanline spacing variation is one of the most visible and undesirable artifacts, appearing as light and dark streaks across a printed page perpendicular to the process direction. Such one dimensional image density variation in the process direction are often periodic and can result from errors in the mechanical motion of rotating components within a marking engine. These components may be gears, pinions, and rollers in the charging and development subsystems, photoreceptors and their drive trains, or the ROS polygon.

Many Xerox production color systems (iGen3 and iGen4, DC8002, DC7002) now include an In-Line-Spectrophotometer (ILS). Systems such as the DC8002/7002 are susceptible to a banding defect. Current ILS implementations do not include mechanisms to robustly deal with banding. The control loop for color management uses the ILS for measurement of the current system state. If a patch falls within an area with banding on a print, the system will read and calibrate according to the readings for that patch. Both dot linearization and characterization (ICC profile generation) use the ILS patch reads to generate new dots and profiles in-situ. The accuracy of the profiles and channel-by-channel correction are limited by the accuracy of the patch measurements. The accuracy of these measurements is dependent on several factors including: ILS repeatability, ILS accuracy, and xerographic variation. ILS repeatability has been shown to be very low and ILS accuracy has been addressed previously via the Spectral Component Analysis (SCA) matrix.

Accordingly, what is needed in this art are increasingly sophisticated systems and methods for creating a dynamic document comprising constant color patch targets whose distance between patch repeats is optimal for reducing banding noise in ILS measurements.

INCORPORATED REFERENCES

The following U.S. patents, U.S. patent applications, and Publications are incorporated herein in their entirety by reference.

"Method And Apparatus For Controlling Non-Uniform Banding And Residual Toner Density Using Feedback Control", U.S. Pat. No. 7,054,568 to Mizes et al.

Systems And Methods For Correcting Banding Defects Using Feedback And/Or Feed Forward Control', U.S. Pat. No. 7,058,325 to Hamby et al.

"Method And System To Compensate For Banding Defects", U.S. Publication No. 20090046325, to Paul et al.

BRIEF SUMMARY

What is disclosed is a novel system and method for correcting for In-Line-Spectrophotometer (ILS) measurements of constant value patches in the presence of a banding defect.

In one example embodiment, the present method for correcting measurements using an in-line spectrophotometer color correction system in the presence of a banding defect involves the following. A constant value color patch is first printed with a document reproduction system having an in-line spectrophotometer color correction system. An ILS data stream is received in response to the in-line spectrophotometer interacting with the constant value patch and the ILS data stream is analyzed to determine a frequency of at least one structured noise component in the document reproduction system that is due to process banding. In one embodiment, analyzing the ILS data stream comprises performing a Fast Fourier Transform of each L*a*b* component in the ILS data stream and identifying a peak frequency of each L* a* and b* channel of the document reproduction system associated with the structured noise components. Peak frequencies are then compared to determine a common frequency across all of the channels. A banding wavelength, $\lambda_{Band}$, is determined from the common frequency. Thereafter, a distance between repeats of a color patch target is adjusted as a function of $\lambda_{Band}$ such that measurements of the color patch target repeats by the ILS system are synchronized to the banding wavelength. If a single peak frequency has been identified in multiple channels, then that single peak frequency is determined to be a frequency of the structured noise component. An embodiment for adjusting the distance between is provided and described herein in further detail.

Many features and advantages of the above-described method will become readily apparent from the following detailed description and accompanying drawings.

BRIEF DESCRIPTION OF THE DRAWINGS

The foregoing and other features and advantages of the subject matter disclosed herein will be made apparent from the following detailed description taken in conjunction with the accompanying drawings, in which.

DETAILED DESCRIPTION

Figure 1:
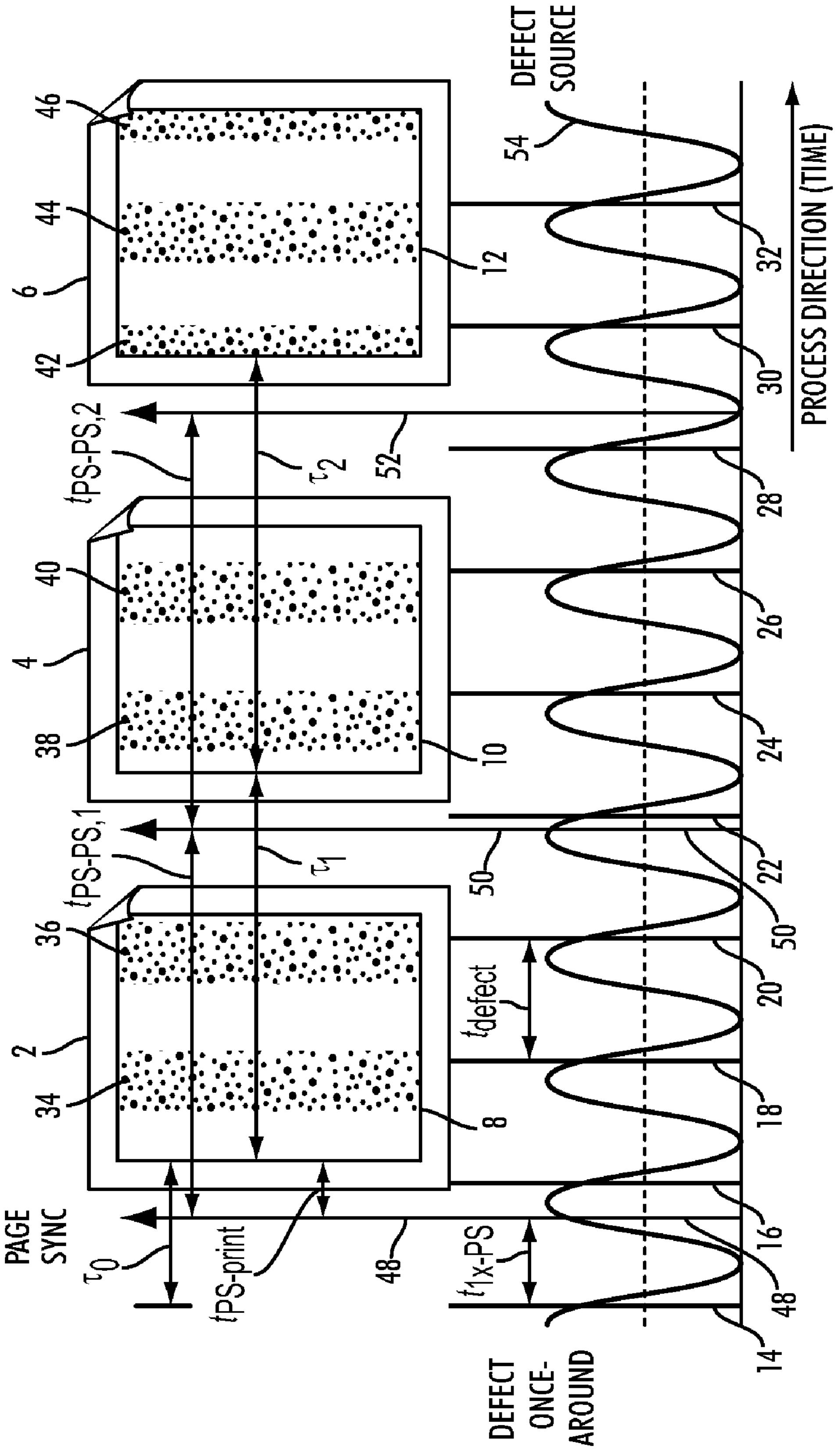
FIG. 1 illustrates the first three pages of a print job of M pages and the effects of a banding defect over time.

What is disclosed is novel system and method for detecting and correcting for In-Line-Spectrophotometer (ILS) measurements of constant value patches in the presence of banding in multi-function document reproduction systems.

It should be understood that one of ordinary skill in this art should be readily familiar with printer quality monitoring and troubleshooting techniques, particularly those which relate to detecting and quantifying xerographic noise, and analyses of scanned test patterns to determine frequency spectra of structured noise components. Those of ordinary skill would be familiar with the text: "*Digital Color Imaging Handbook",* 1st Ed., CRC Press (2003), ISBN-13: 97808-4930-9007, and "*Control of Color Imaging Systems: Analysis and Design*", CRC Press (2009), ISBN-13: 97808-4933-7468, both of which are incorporated herein in their entirety by reference.

A "reflectance sensing device", as used herein, refers to a spectrophotometric device having a plurality of illuminators for illuminating a sample of interest and photoreceptor sensors for measuring reflect light from the sample. Each illuminator is a light source having a respective spectrum range. Example illuminators are Infrared (IR) LED, visible LED, and incandescent lamp. A reflectance sensing device may have illuminators of different colors or a single illuminator (white) with different color filters. The illuminators are switched on/off in a predetermined sequence such that spectral measurements can be obtained in each illuminator's wavelength range.

A "spectrophotometer" is one reflectance sensing device which measures a reflectance over many wavelengths and provides distinct electrical signals corresponding to the different levels of reflected light received from the respective different illumination wavelength ranges using multiple channels. A model-based spectrophotometer is a reflectance sensing device that is able to deduce spectral reflectance information for areas of the spectrum that have not been measured directly by utilizing a mathematical model or fitting parameters. This is in contrast to a "first-principles" device which reports spectral reflectance information measured directly at various wavelengths of interest.

An "ILS color correction system" is a system which employs an in-line spectrophotometer to obtain ILS data from color images.

An "ILS data stream" refers to spectral reflectance information reported by the ILS color correction system. Such information generally comprises a plurality of reflectance values, each corresponding to a wavelength or channel of the spectrophotometer device employed. For example, a Gretag Spectrophotometer outputs 36 reflectance values (1 per channel) evenly spaced at 10 nm intervals over a spectrum of 380 nm to 730 nm. An X-Rite Spectrophotometer outputs 31 reflectance values evenly spaced at 10 nm intervals over a spectrum of 400 nm to 700 nm. Spectral measurements of color test targets may further be converted using known extrapolation algorithms.

A "structured noise component" is a component in a document reproduction system which induces noise into an image which has a periodic element in the process direction.

A "banding defect" is defined as a one dimensional image density variation in the process direction and comprises either horizontal or vertical bands which have a wavelength period that varies from a minimum to a maximum frequency over time. The frequency of the banding can be measured using Fourier analysis. Noise due to process banding can arise from errors in the mechanical motion of rotating components such as, for instance, gears, pinions, rollers in various subsystems, photoreceptors and their drive trains, and the like. The periodic element is usually dominated by particular frequencies which help identify the noise source. FIG. 1 illustrates an example banding defect.

Brief General Discussion

Xerographic noise which comprises two primary components, i.e., a random or "white" component, and a structured noise component. The remaining component of xerographic variation has also been addressed by using several measurements of the same target and averaging them in an effort to decrease the noise inherent in printing (e.g. within run and run-to-run variation). Averaging several patches reduces the unstructured noise component but may not reduce the patch noise introduced by banding. The relationship between the distance between patch repeats and the banding wavelength will determine the efficacy of averaging the structured noise out of the patch. The present system and method analyzes the ILS data stream and attempts to identify structured noise components due to banding. An FFT is performed on each L*a*b* component in the ILS data stream for a single color test page. The peak frequencies from the FFT of the L* a* and b* channels are compared. Common frequencies in all 3 channels indicate a banding component. Once the banding frequencies and the banding wavelength are known, the color patch target are adjusted to create a dynamic test patch document whose distance between patch repeats is synchronized to the banding wavelength. By running a series of synchronized test patches and averaging the results the structured noise, a reduction of banding effects on color calibration is achieved and improved customer satisfaction effectuated. The teachings hereof can readily be made available on a machine as a service tool when enables engineers and/or technicians to know when there is a banding problem (via remote diagnostics). If the banding problem is severe enough, the system can also account for this banding depending on the severity and frequency of the bands.

Reference is now briefly being made to FIG. 1 which shows the first three pages of a print job of M pages and the effects of a banding defect over time. The boxes with the folded upper right hand corners depict pieces of paper 2, 4, and 6 with printed images or test targets 8, 10, and 12, respectively. These are intended to represent any known sampling interval, such as inter-document zones, customer image zones, or printed pages. The images 8, 10, and 12 on the pieces of paper 2, 4, and 6 represent test targets designed for defect estimation. In the absence of banding defects, the printed test image should be a uniform mid-tone (i.e., approximately 50% area coverage). Because of banding, the printed test targets 8, 10, and 12 are not uniform in density, but have a periodic density variation in the process direction. Note that the frequency and amplitude of the banding is roughly the same for each test print, but the banding phase relative to the first imaged line is different on every page. In order to efficiently estimate the defect profile, timing information that will place every imaged page relative to the banding source, which is independent of the start of the page, will have to be obtained. The banding source (or defect) once-around is represented by a series of vertical lines (14, 16, 18, 20, 22, 24, 26, 28, 30 and 32). This signal may be obtained by placing a low cost once-around sensor on the defect source in the printer. This once-around signal corresponds to the periodic thick, dark lines (34, 36, 38, 40, 42, 44, and 46) in the images 8, 10 and 12. The page sync signal, available on any printer, is marked by a series of impulses 48, 50 and 52. The banding defect is represented by a waveform 54, whose one-period profile is to be estimated.

Figure 2:
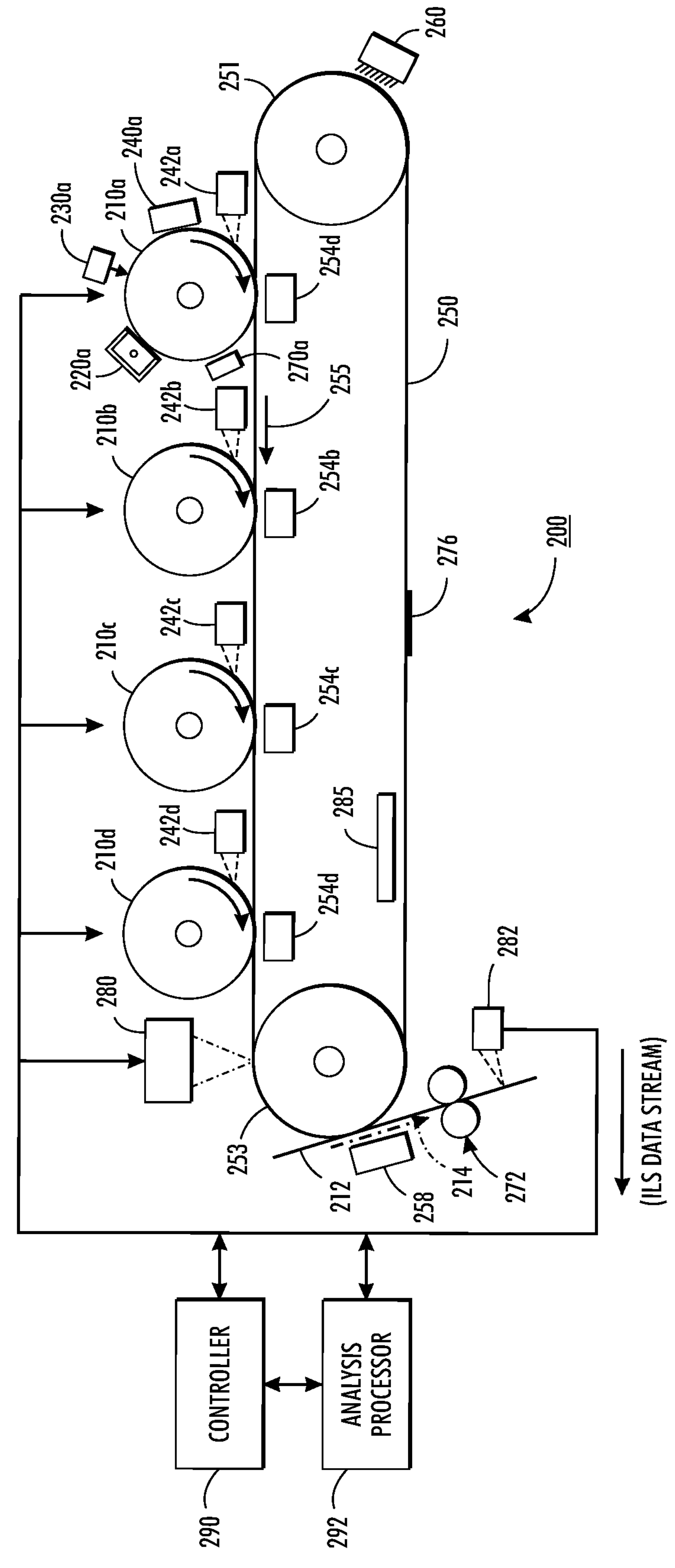
FIG. 2 is a component diagram illustrating one example digital document reproduction system that includes a color-tandem architecture and an ILS color correction system.

Reference is now made to FIG. 2 which is a component diagram illustrating an example digital document reproduction system 200 that includes a color-tandem architecture and an ILS color correction system.

The color tandem architecture 200 includes a multi-color image forming device with a plurality of print stations arranged in series, each of which transfers a different color toner image of a multicolor image to an intermediate transfer member 250. A first photoreceptor drum 210*a* includes a charging device 220*a*, an exposing device 230*a*, a developer device 240*a* and a cleaning device 270*a*. A single color toner image formed on first photoreceptor drum 210*a* is transferred to intermediate transfer belt 250 by first transfer corotron 254*a*. Transfer belt 250 is wrapped around rollers 251, 253 which tension the transfer belt and are also driven to move belt 250 in the direction of arrow 255. Second, third and fourth photoreceptors 210*b*, 210*c*, 210*d* also include charging, exposing, developing, and cleaning devices (not shown) to form and transfer second, third and fourth single-color toner images to belt 250 (on top of each other) using transfer corotrons 254*b*, 254*c*, 254*d*. Typically, these would include separate stages for each of cyan, magenta, yellow and black colorants. Although four stages are shown, fewer or greater stages can be present. The multicolor image that is formed on belt 250 is then transferred to receiving media 212, such as paper, by corotron 258. Media 212 moves in the direction of arrow 214 through fusing station 272.

After the transfer of the multi-color image to the receiving material 212, a residue of the multicolor image, represented as residual toner patch 276, may remain on the intermediate belt 250. Upon completion of transfer of the image to media 212, the intermediate belt passes in contact with backing plate 285 which aids in retaining a shape of the belt, and then passes through cleaning station 260 to remove the residual toner. The intermediate belt 450 then advances around to re-engage photoreceptors 410*a-d* as known in the art.

The color tandem architecture of FIG. 2 includes a plurality of sensors which individually and collectively perform a color correction function. For example, each of the photoreceptor drums 210*a*, 210*b*, 210*c* and 210*d*, includes sensor 242*a*, 242*b*, 242*c*, and 242*d*, respectively, which operate to sense the image formed on the photoreceptor itself. Such a sensor is generally designed to sense images with high signal to noise ratios. Sensor 280 is an on-belt reflectance sensing device which obtains measurement data directly from the surface of the photoreceptor belt. The data stream produced by sensor 280 is provided to controller 290 which operates to adjust timing signals to various print system components to detected minimize motion disturbance sources. Sensor 282 is a reflectance sensing device which obtains measurements directly from the color images printed on media 212 and produces an ILS data stream containing reflectance measurement data.

Controller 290 provides data and control to the several photoreceptors 210*a-d* and associated components. Controller 290 further accepts signals from other sources and produces page sync signals used to assemble multiple images into coherent time domain samples. A page sync recorder (not shown) stores various time stamps that indicate a relative time between the start of printed of toner images and/or pages of which images are captured by either an internal printer sensor or offline scanner. Analysis processor 292 is a special purpose computer system capable of performing various aspects of the present method as described with respect to the flow diagram of FIG. 3. One embodiment is shown and discussed with respect to FIG. 5.

The present method analyzes the ILS data stream received from various of the above-described sensors and identifies structured noise components due to banding. Once the banding frequencies and the banding wavelength are known, a distance between color patch targets on a printed sheet are adjusted to create a dynamic test patch document whose distance between patch repeats is synchronized to the banding wavelength.

Figure 3:
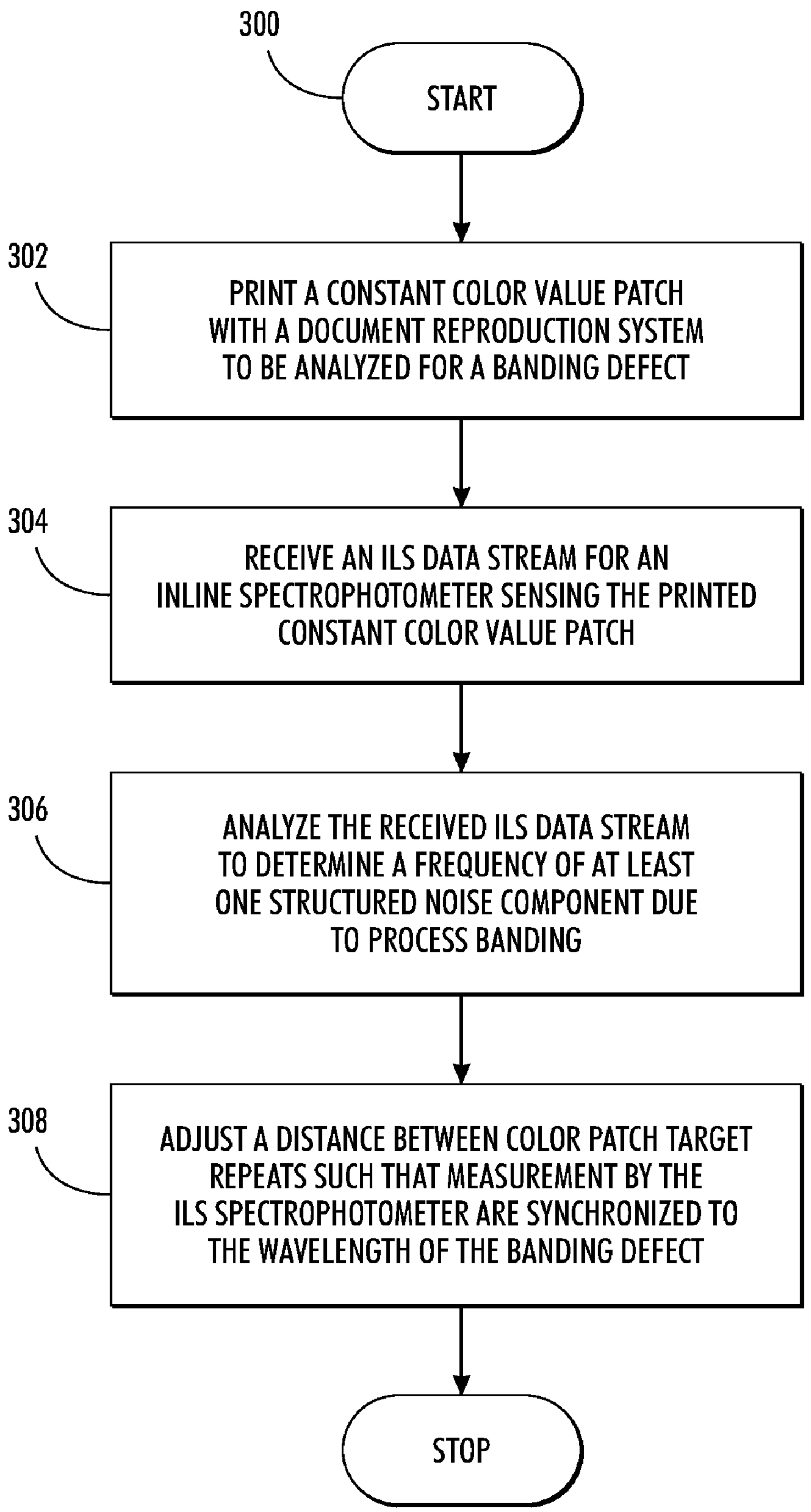
FIG. 3 is a flow diagram illustrating one example embodiment of the present method for correcting measurements obtained using an in-line spectrophotometer in the presence of a banding defect.

Reference is now being made to the flow diagram of FIG. 3 which illustrates one example embodiment of the present method for correcting measurements obtained using an in-line spectrophotometer in the presence of a banding defect. Flow processing beings at step 300 and immediately proceeds to step 302.

At step 302, a constant value color patch is printed with a document reproduction system having an ILS color correction system which is intended to be analyzed for a banding defect. One such system is shown and discussed with respect to the architecture of FIG. 2.

At step 304, an ILS data stream is received in response to an in-line spectrophotometer sensing device interacting with the constant value patch.

At step 306, the ILS data stream is analyzed to determine a frequency of at least one structured noise component that is due to process banding. In one embodiment, analyzing the ILS data stream to determine a frequency of the at least one structured noise component due to process banding involves performing a Fast Fourier Transform of each L*a*b* component in the ILS data stream and then identifying a peak frequency of each L* a* and b* channel of the document reproduction system associated with the structured noise component. The peak frequencies are then compared to determine a common frequency across all of the channels. The wavelength $\lambda_{Band}$ is determined from the common frequency. If only a single peak frequency has been identified in multiple channels then that single peak frequency is determined to be a frequency of the structured noise component. In one embodiment, At step 308, a distance between repeats of a color patch target is adjusted as a function of a wavelength $\lambda_{Band}$ of the determined frequency of the structured noise component such that measurements by the in-line spectrophotometer of the color patch target repeats are synchronized to the banding wavelength. Thereafter, further processing stops.

In one embodiment, a distance between color patch target repeats is given by:

$$\lambda_{Rep} = \lambda_{Band} \cdot \left[\frac{N+1}{K}\right], \tag{1}$$

where N is an integer and depending on a value of N, repeats of a given color patch target may lie on a same page or on different pages, and where K is the number of repeats. This assures that each color is sampled at equal intervals of a cycle.

Figure 4:
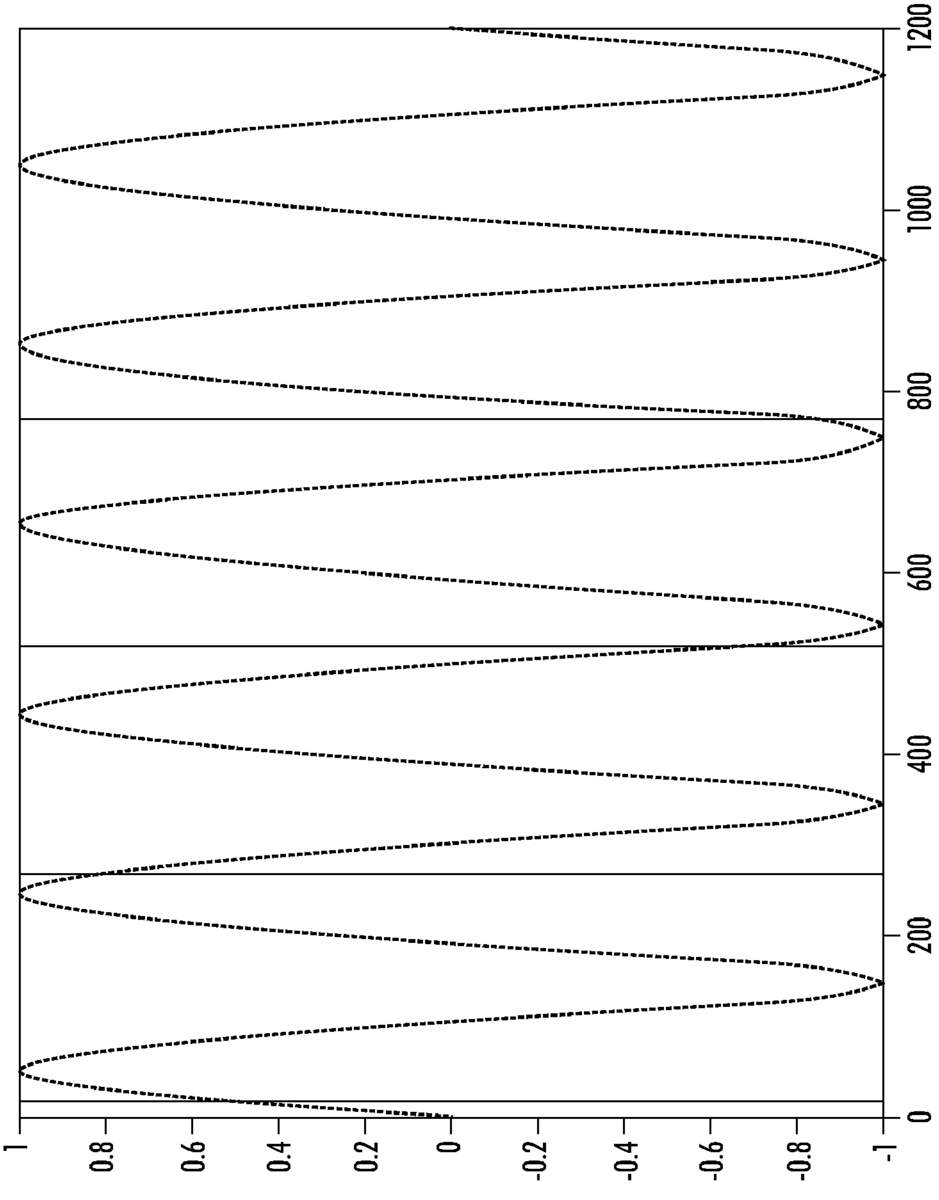
FIG. 4 illustrates a graph of sampling for 4 samples.

As an example, the graph of FIG. 4 illustrates a sampling for 4 samples. Notice that the samples are not necessarily measured in the same cycle but that the distance between samples is an integer number of cycles plus ¼ of a cycle (for 4 samples). With the sampling as described above the measured L* of the $k^{th}$ patch will be:

$$L^*(k) = L_{avg} + L_{ac} * \sin\left(2\pi\lambda_{Band} * k * \left[\frac{N+1}{K}\right] \Big/ \lambda_{Band} + \alpha\right) + v(k), \quad (2)$$

$$= L_{avg} + L_{ac} * \sin\left(\left[\frac{2\pi k}{K}\right] + \alpha\right), \quad (3)$$

where $L_{avg}$ is the average L* of that patch, $L_{ac}$ is the structured noise due to banding at a given wavelength, and v(k) is the uncorrelated noise.

If we average all of the L*(k) together, we get:

$$\left(\Sigma_k\left\{L_{avg} + L_{ac} * \sin\left(\left[\frac{2\pi k}{K}\right] + \alpha\right)\right\} + v(k)\right) \Big/ K = L_{avg} + (\Sigma_k\ v(k))/K. \quad (4)$$

In other words, all of the sinusoidal components will cancel out and only the average L* with the uncorrelated noise remains. Since the distance between repeats is a function of the banding wavelength the calibration target needs to be created dynamically in a system if the banding is measured dynamically. The patch colors remain the same but the patch order is permuted to meet the distance between similar colors according to Eq. (1). The same document cannot be submitted K times, as the desired distance of Eq. (1) may not be met.

Once the distance between color patch repeats has been synchronized to the wavelength of the identified structured noise component due to process banding, subsequent measurements by the device's color control system have improved ILS repeatability and ILS accuracy.

Figure 5:
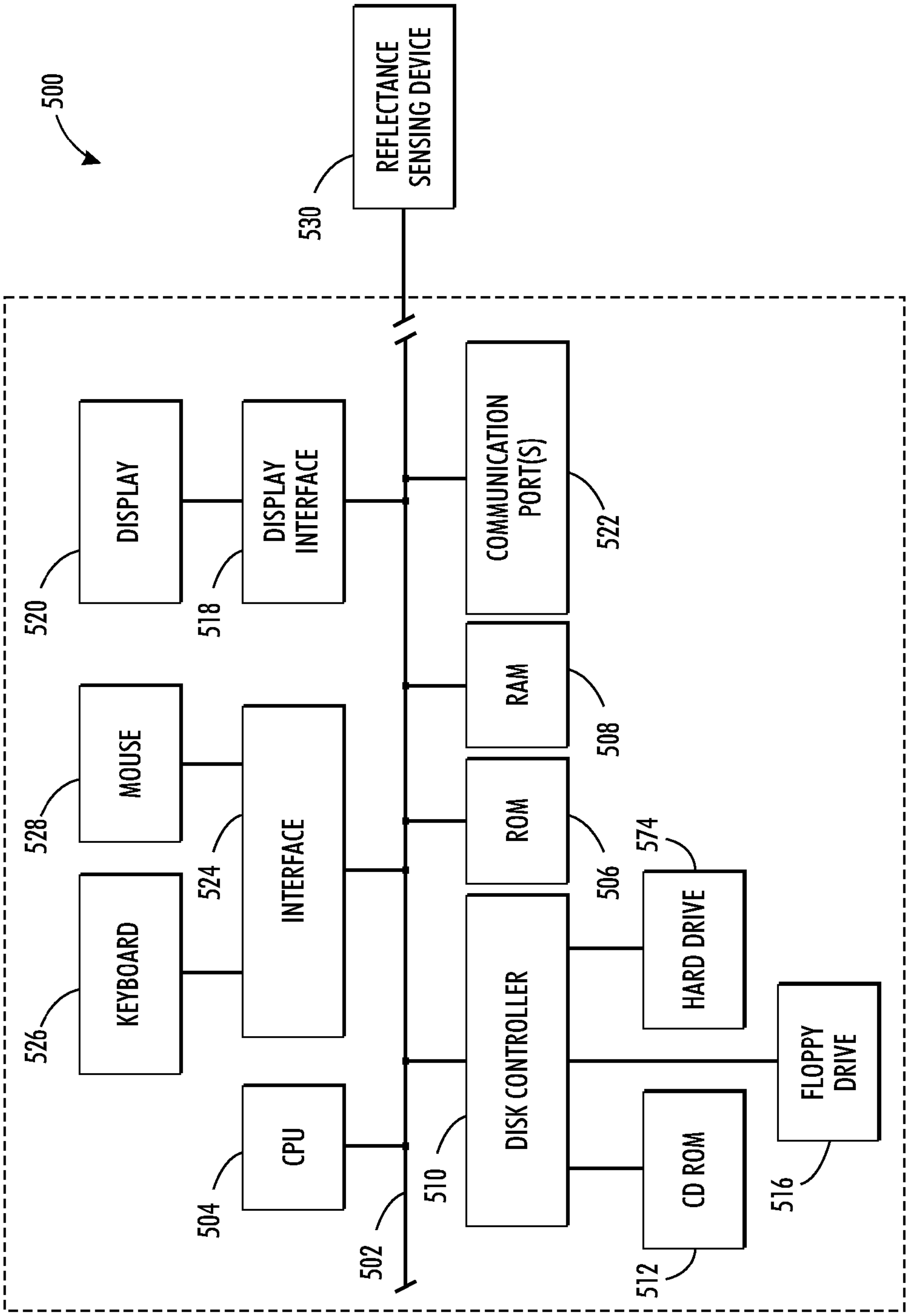
FIG. 5 illustrates a block diagram of one example embodiment of a special purpose computer system for implementing one or more aspects of the present method as described with respect to the embodiments of the flow diagram of FIG. 3.

Reference is now being made to FIG. 5 which illustrates a block diagram of one example embodiment of a special purpose computer system for implementing one or more aspects of the present method as described with respect to the embodiments of the flow diagram of FIG. 3. Such a special purpose processor is capable of executing machine executable program instructions. The special purpose processor may comprise any of a micro-processor or micro-controller, an ASIC, an electronic circuit, or special purpose computer. Such a computer can be integrated, in whole or in part, with a xerographic system or a color management or image processing system, which includes a processor capable of executing machine readable program instructions for carrying out one or more aspects of the present method.

In FIG. 5, communications bus 502 serves as an information highway interconnecting the other illustrated components of special purpose computer system 600 which is in communication with reflectance sensing device 530 which may be one or both of the above-described subject reflectance sensing device or the master reflectance sensing device. The special purpose computer incorporates a central processing unit (CPU) 504 capable of executing machine readable program instructions for performing any of the calculations, comparisons, logical operations, and other program instructions for performing any of the steps described above with respect to the flow diagrams and illustrated embodiments hereof. Processor 504 is in communication with memory (ROM) 506 and memory (RAM) 508 which, collectively, constitute example storage devices. Such memory may be used to store machine readable program instructions and other program data and results to sufficient to carry out any of the functionality described herein with respect to the flow diagram of FIG. 3. Disk controller 510 interfaces with one or more storage devices 514. These storage devices may comprise external memory, zip drives, flash memory, USB drives, or other devices such as CD-ROM drive 512 and floppy drive 516. The storage device may store machine executable program instructions for executing the methods hereof. Such storage devices may be used to implement a database wherein various records are stored. Display interface 518 effectuates the display of information on display 520 in various formats such as, for instance, audio, graphic, text, and the like. Interface 524 effectuates a communication via keyboard 526 and mouse 528, collectively a graphical user interface. Such a graphical user interface is useful for a user to enter information about any of the displayed information in accordance with various embodiments hereof. Communication with external devices may occur using example communication port(s) 522. Such ports may be placed in communication with any of the example networks shown and described herein, such as the Internet or an intranet, either by direct (wired) link or wireless link. Example communication ports include modems, network cards such as an Ethernet card, routers, a PCMCIA slot and card, USB ports, and the like, capable of transferring data from one device to another. Software and data is transferred via the communication ports in the form of signals which may be any of digital, analog, electromagnetic, optical, infrared, or other signals capable of being transmitted and/or received by the communications interface. Such signals may be implemented using, for example, a wire, cable, fiber optic, phone line, cellular link, RF, or other signal transmission means presently known in the arts or which have been subsequently developed.

The computations necessary to establish and/or to determine adjustment of individual image formation parameters such as, for example, selection from among the individual available thresholds and/or dilation parameters, may be implemented within a circuit in the image forming device itself. Alternatively, such computations may be performed on a programmable general purpose computer, special purpose computer, program microprocessor or microcontroller, or other like digital signal processing devices. These other like digital signal processor may include, but are not limited to, peripheral integrated circuit elements, ASIC, or other integrated circuits, hard-wired electronic or logic circuit, or the like, or may even be manipulated through manual adjustment of one or more operating parameters and/or user-adjustable input parameters that may be associated with one or more of the operating parameters of the system and methods disclosed. It should be appreciated that, given the required inputs, to include, but not be limited to, appropriate information regarding thresholds and/or inputs regarding device settings, and the like, and may include inputting software algorithms or any combination of software, hardware and/or firmware control parameters to implement the individual devices and/or modules hereof in varying combinations.

It will be appreciated that the above-disclosed and other features and functions, or alternatives thereof, may be desirably combined into many other different systems or applications. Various presently unforeseen or unanticipated alternatives, modifications, variations, or improvements therein may become apparent and/or subsequently made by those skilled in the art which are also intended to be encompassed by the following claims. Accordingly, the embodiments set forth above are considered to be illustrative and not limiting. Various changes to the above-described embodiments may be made without departing from the spirit and scope of the invention. The teachings hereof can be implemented in hardware or software using any known or later developed systems, structures, devices, and/or software by those skilled in the applicable art without undue experimentation from the functional description provided herein with a general knowledge of the relevant arts.

Moreover, the methods hereof can be implemented as a routine embedded on a personal computer or as a resource residing on a server or workstation, such as a routine embedded in a plug-in, a photocopier, a driver, a scanner, a photographic system, a xerographic device, or the like. The methods provided herein can also be implemented by physical incorporation into an image processing or color management system. Furthermore, the teachings hereof may be partially or fully implemented in software using object or object-oriented software development environments that provide portable source code that can be used on a variety of computer, workstation, server, network, or other hardware platforms. One or more of the capabilities hereof can be emulated in a virtual environment as provided by an operating system, specialized programs or leverage off-the-shelf computer graphics software such as that in Windows, Java, or from a server or hardware accelerator or other image processing devices.

One or more aspects of the methods described herein are intended to be incorporated in an article of manufacture, including one or more computer program products, having computer usable or machine readable media. The article of manufacture may be included on at least one storage device readable by a machine architecture or other xerographic or image processing system embodying executable program instructions capable of performing the methodology described herein. The article of manufacture may be included as part of a xerographic system, an operating system, a plug-in, or may be shipped, sold, leased, or otherwise provided separately either alone or as part of an add-on, update, upgrade, or product suite.

It will be appreciated that various of the above-disclosed and other features and functions, or alternatives thereof, may be combined into other systems or applications. Various presently unforeseen or unanticipated alternatives, modifications, variations, or improvements therein may become apparent and/or subsequently made by those skilled in the art which are also intended to be encompassed by the following claims. Accordingly, the embodiments set forth above are considered to be illustrative and not limiting.

Various changes to the above-described embodiments may be made without departing from the spirit and scope of the invention. The teachings of any printed publications including patents and patent applications, are each separately hereby incorporated by reference in their entirety.

What is claimed is:

1. A method for correcting measurements obtained using an in-line spectrophotometer in the presence of a banding defect, the method comprising:

printing a constant value color patch with a document reproduction system having an ILS color correction system;

receiving an ILS data stream in response to said in-line spectrophotometer interacting with said constant value patch;

analyzing said ILS data stream to determine a frequency of at least one structured noise component in said document reproduction system that is due to process banding; and adjusting a distance between repeats of a color patch target as a function of a wavelength $\lambda_{Band}$ of said determined frequency of said at least one structured noise component, such that measurements by said in-line spectrophotometer of said color patch target repeats are synchronized to said banding wavelength, said adjusting comprising:

$$\lambda_{Rep}=\lambda_{Band}\cdot(N+1/K),$$

where N is an integer and K is the number of repeats.

2. The method of claim 1, wherein analyzing said ILS data stream to determine a frequency of said at least one structured noise component due to process banding comprises:

performing a Fast Fourier Transform of each L*a*b* component in said ILS data stream;

identifying a peak frequency of each L* a* and b* channel of said document reproduction system associated with said at least one structured noise component; and comparing peak frequencies to determine a common frequency across all of said channels, said wavelength $\lambda_{Band}$ being determined from said common frequency.

3. The method of claim 2, wherein, in response to a single peak frequency having been identified in multiple channels, further comprising determining that single peak frequency to be a frequency of said structured noise component.

4. The method of claim 1, wherein, in response to a frequency of at least one structured noise component having been determined, further comprising initiating an activity associated with said document reproduction system.

5. The method of claim 4, wherein said activity comprises any of: sending a control signal to said document reproduction system, and sending an alert to an operator of said document reproduction system, wherein said alert comprises any of: an indication of a deterioration of at least one component of said document reproduction system, and an indication of at least one part, based upon said recurring banding frequency, within said document reproduction system that is deteriorating.

6. A system for correcting measurements obtained using an in-line spectrophotometer in the presence of a banding defect, the system comprising:

a memory;

a storage medium for storing data; and a processor in communication with said storage medium and said memory, said processor executing machine readable instructions for performing the method of:

printing a constant value color patch with a document reproduction system having an ILS color correction system;

receiving an ILS data stream in response to said in-line spectrophotometer interacting with said constant value patch;

analyzing said ILS data stream to determine a frequency of at least one structured noise component in said document reproduction system that is due to process banding; and adjusting a distance between repeats of a color patch target as a function of a wavelength $\lambda_{Band}$ of said determined frequency of said at least one structured noise component, such that measurements by said in-line spectrophotometer of said color patch target repeats are synchronized to said banding wavelength, said adjusting comprising:

$$\lambda_{Rep}=\lambda_{Band}\cdot(N+1/K),$$

where N is an integer and K is the number of repeats.

7. The system of claim 6, wherein analyzing said ILS data stream to determine a frequency of said at least one structured noise component due to process banding comprises:

performing a Fast Fourier Transform of each L*a*b* component in said ILS data stream;

identifying a peak frequency of each L* a* and b* channel of said document reproduction system associated with said at least one structured noise component; and comparing peak frequencies to determine a common frequency across all of said channels, said wavelength $\lambda_{Band}$ being determined from said common frequency.

8. The system of claim 7, wherein, in response to a single peak frequency having been identified in multiple channels, further comprising determining that single peak frequency to be a frequency of said structured noise component.

9. The system of claim 6, wherein, in response to a frequency of at least one structured noise component having been determined, further comprising initiating an activity associated with said document reproduction system.

10. The system of claim 9, wherein said activity comprises any of: sending a control signal to said document reproduction system, and sending an alert to an operator of said document reproduction system, wherein said alert comprises any of: an indication of a deterioration of at least one component of said document reproduction system, and an indication of at least one part, based upon said recurring banding frequency, within said document reproduction system that is deteriorating.

11. A computer implemented method for correcting measurements obtained using an in-line spectrophotometer in the presence of a banding defect, the method comprising:

printing a constant value color patch with a document reproduction system having an ILS color correction system;

receiving an ILS data stream in response to said in-line spectrophotometer interacting with said constant value patch;

analyzing said ILS data stream to determine a frequency of at least one structured noise component in said document reproduction system that is due to process banding, comprising:

performing a Fast Fourier Transform of each L*a*b* component in said ILS data stream;

identifying a peak frequency of each L* a* and b* channel of said document reproduction system associated with said at least one structured noise component; and comparing peak frequencies to determine a common frequency across all of said channels, said wavelength $_{Band}$ being determined from said common frequency; and adjusting a distance between repeats of a color patch target as a function of a wavelength $\lambda_{Band}$ of said determined frequency of said at least one structured noise component, comprising:

$$\lambda_{Rep}=\lambda_{Band}\cdot(N+1/K),$$

where N is an integer and depending on a value of N, repeats of a given color patch target may lie on a same page or on different pages, and where K is the number of repeats.

12. The computer implemented method of claim 11, wherein, in response to a single peak frequency having been identified in multiple channels, further comprising determining that single peak frequency to be a frequency of said structured noise component.

13. The computer implemented method of claim 11, wherein, in response to a frequency of at least one structured noise component having been determined, further comprising initiating an activity associated with said document reproduction system.

14. The computer implemented method of claim 13, wherein said activity comprises any of: sending a control signal to said document reproduction system, and sending an alert to an operator of said document reproduction system, wherein said alert comprises any of: an indication of a deterioration of at least one component of said document reproduction system, and an indication of at least one part, based upon said recurring banding frequency, within said document reproduction system that is deteriorating.

* * * * *